(12) United States Patent
Gasper et al.

(10) Patent No.: US 8,461,893 B2
(45) Date of Patent: Jun. 11, 2013

(54) UNIFORM-FOOTPRINT PROGRAMMABLE MULTI-STAGE DELAY CELL

(75) Inventors: Martin J. Gasper, Zionsville, PA (US); Gerard M. Blair, Bath, PA (US); Bruce E. Zahn, Allentown, PA (US)

(73) Assignee: LSI Corporation, Milpitas, CA (US)

( * ) Notice: Subject to any disclaimer, the term of this patent is extended or adjusted under 35 U.S.C. 154(b) by 121 days.

(21) Appl. No.: 13/210,664

(22) Filed: Aug. 16, 2011

(65) Prior Publication Data

US 2013/0043923 A1 Feb. 21, 2013

(51) Int. Cl.
*H03H 11/06* (2006.01)
(52) U.S. Cl.
USPC ............ 327/261; 327/264; 327/278; 327/285
(58) Field of Classification Search
USPC .......... 327/261, 263–264, 276–278, 284–285
See application file for complete search history.

(56) References Cited

U.S. PATENT DOCUMENTS

| 5,227,679 | A  | * | 7/1993 | Woo ................................ 326/50 |
| 5,821,783 | A  | * | 10/1998 | Torimaru et al. ............. 327/108 |
| 6,356,132 | B1 |   | 3/2002 | Mastrocola et al. |
| 7,199,618 | B2 | * | 4/2007 | Gliese et al. .................... 326/98 |
| 7,230,457 | B2 |   | 6/2007 | Waldrop |
| 7,525,356 | B2 |   | 4/2009 | Hui et al. |
| 2003/0048122 | A1 |   | 3/2003 | Kazi |

* cited by examiner

*Primary Examiner* — An Luu

(57) ABSTRACT

Described embodiments provide a delay cell for a complementary metal oxide semiconductor integrated circuit. The delay cell includes a delay stage to provide an output signal having a programmable delay through the delay cell. The delay cell has a selectable delay value from a plurality of delay values, where the cell size and terminal layout of the delay cell are relatively uniform for the plurality of delay values. The delay stage includes M parallel-coupled inverter stages. Each parallel-coupled inverter stage includes N pairs of stacked PMOS transistors and stacked NMOS transistors. The N transistor pairs have configurable source-drain node connections between a drain node and a source node of each transistor in the pair, wherein the selectable delay value corresponds to a configuration of the configurable source-drain node connections to adjust a delay value of each of the M inverter stages.

28 Claims, 11 Drawing Sheets

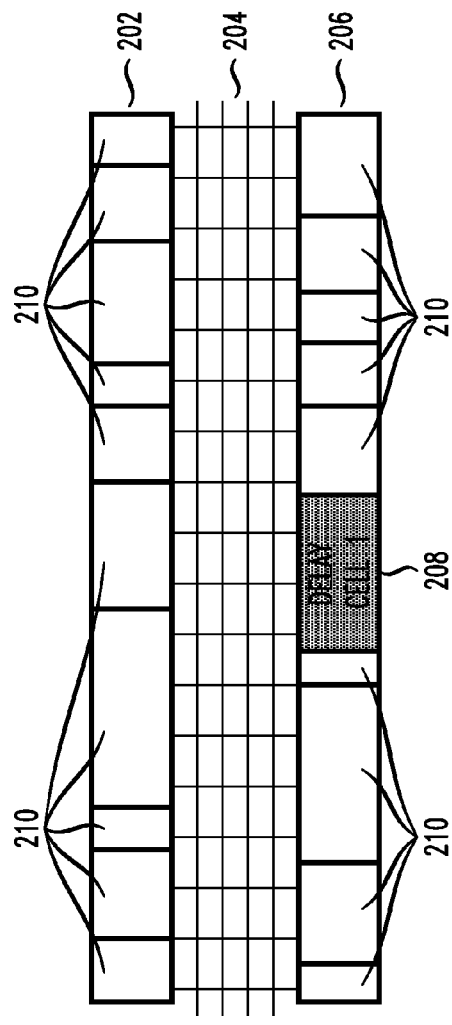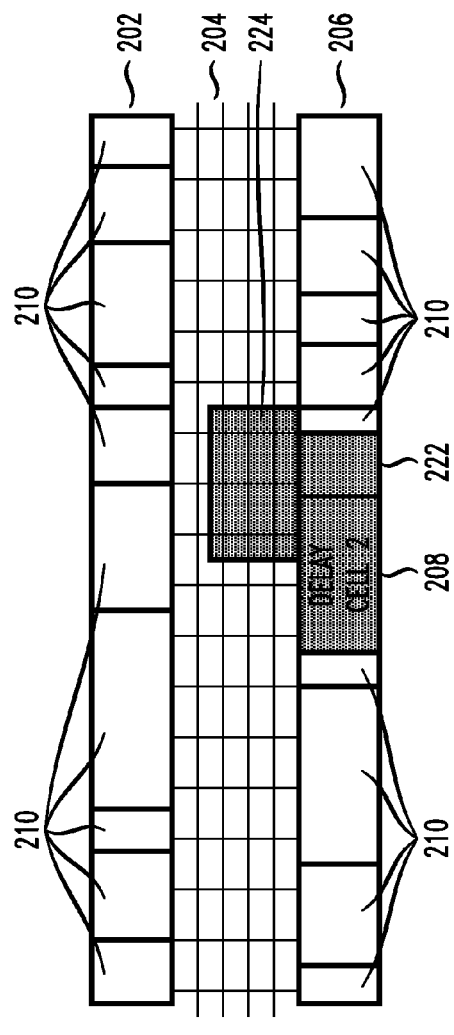
FIG. 2a PRIOR ART
FIG. 2b PRIOR ART

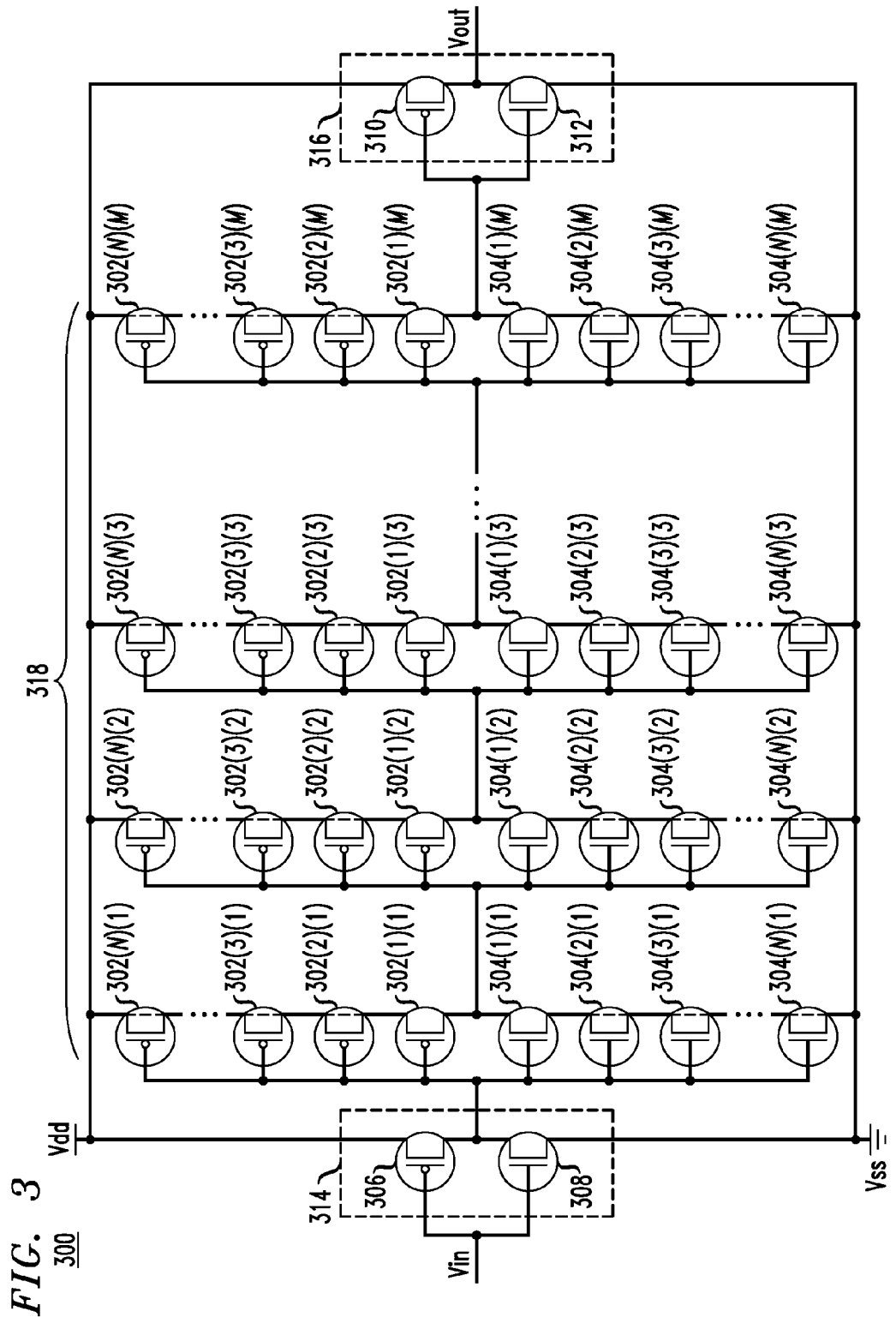

300

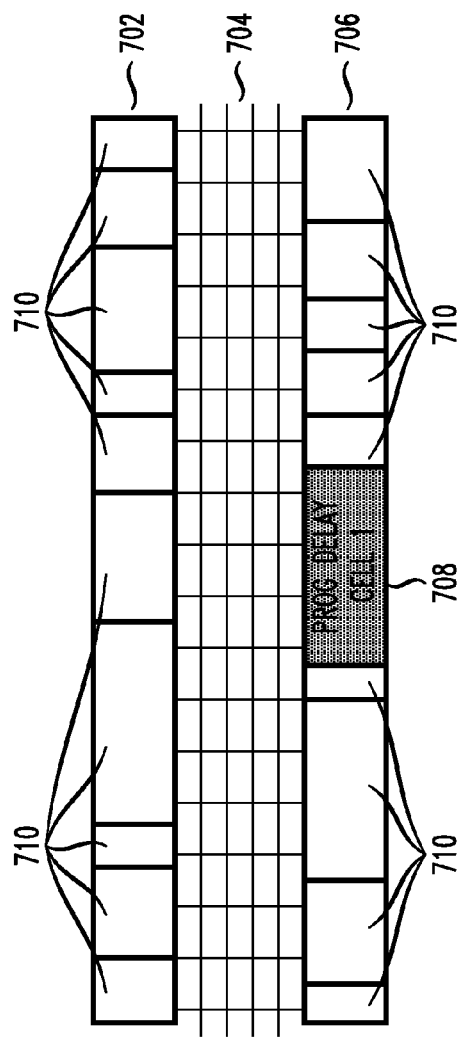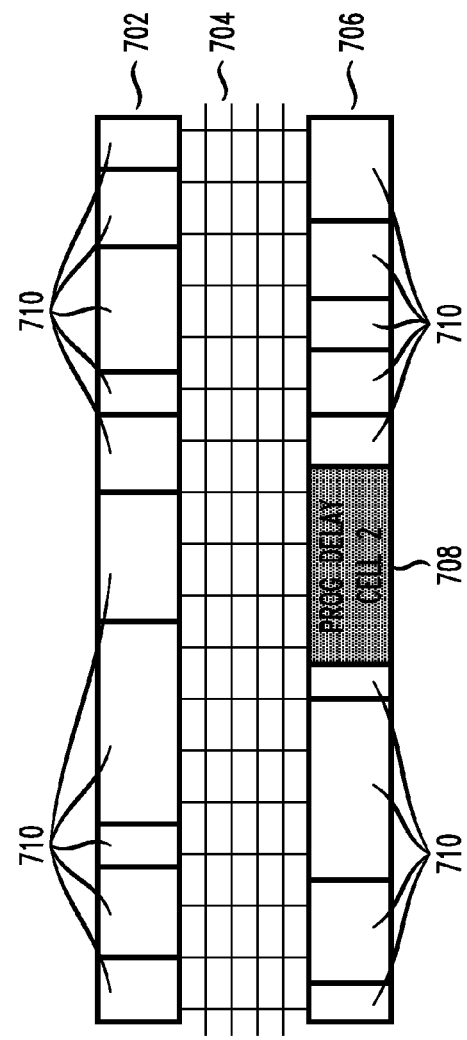
FIG. 7a
FIG. 7b

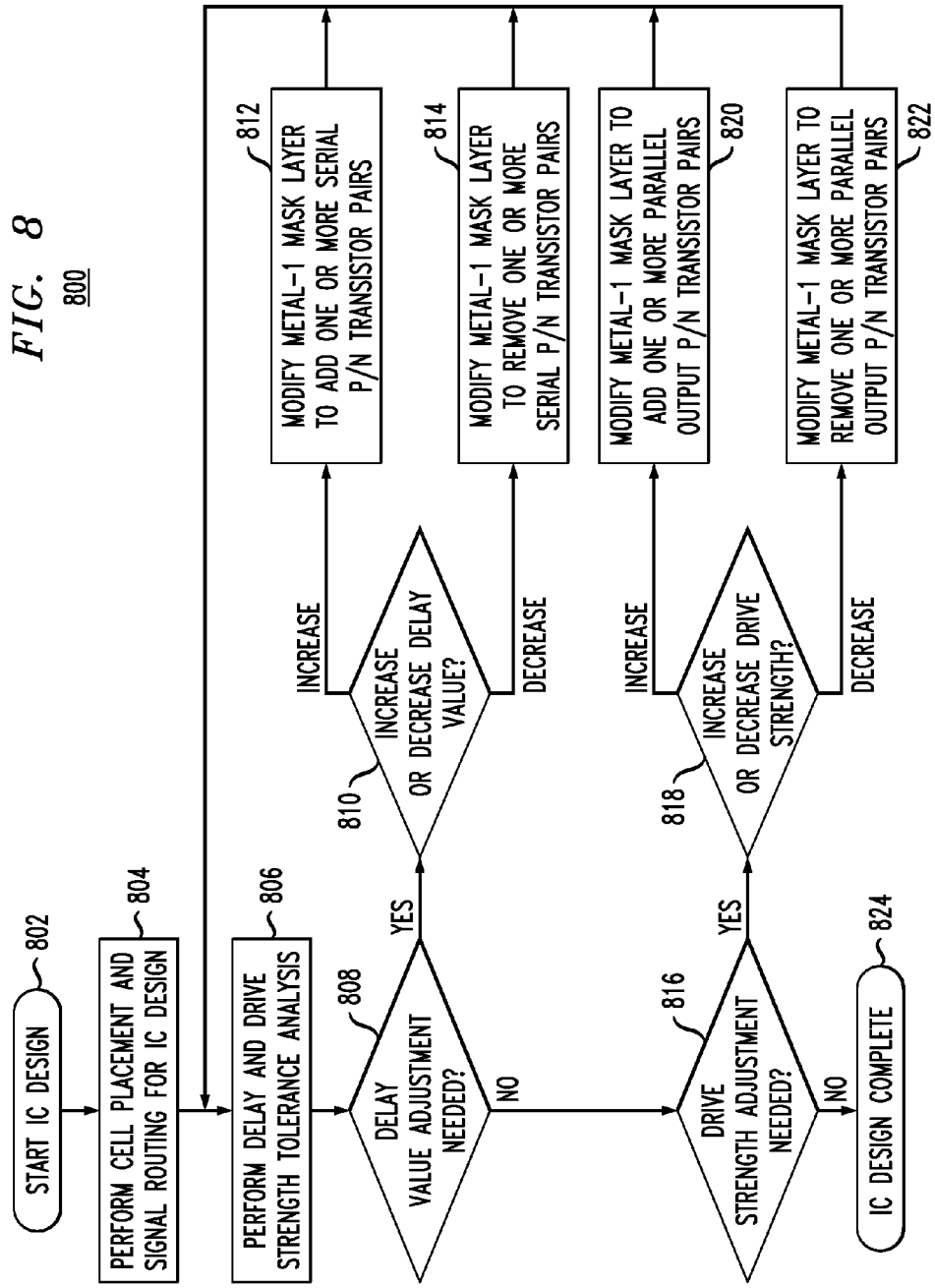

900

UNIFORM-FOOTPRINT PROGRAMMABLE MULTI-STAGE DELAY CELL

BACKGROUND OF THE INVENTION

1. Field of the Invention

The present invention relates to electronic circuits and, in particular, to a programmable delay cell for managing timing skew in an integrated circuit.

2. Description of the Related Art

Complementary metal oxide semiconductor (CMOS) integrated circuits (ICs) typically include one or more clock networks for providing one or more clock signals to various circuit elements of the IC. The clock networks include one or more clock sources coupled to one or more clock "sinks"—circuit elements that require a clock signal. Typical clock sinks might include flip-flops, latches, registers, gates and other circuit elements. In general, clock signals are regularly timed periodic signals, which might be utilized for timing purposes, for example, to synchronize, switch or trigger one or more circuit elements of the IC. A typical clock signal might be generated by a crystal-based clock, a phase-locked loop (PLL) clock, a ring oscillator or other similar circuits either internal to or external to the IC.

The timing of clock and data signals in ICs is typically precisely controlled, and clock signals routed within the IC are desirably synchronized such that each clock sink receives the same clock signal at approximately the same time. A common problem in IC design is "clock skew". Clock skew occurs if clock signals arrive at the various clock sinks at different times, impairing synchronized operation of circuit elements of the IC. Thus, the delay faced by a given data or clock signal over its respective signal path, from the signal source to the signal sink, is accounted for in the design and implementation of an IC. For example, the path length, resistance, parasitic capacitance, parasitic inductance, the number and type of attached clock sinks, and other characteristics of a given signal path might affect the delay between a given signal source and a given signal sink.

Therefore, an IC designer attempts to ensure that the various clock signal paths of a given clock network have substantially the same signal delay. Fine tuning of circuit path timing in the IC design (termed "timing closure") involves the completing complex circuit placement and routing routines along with tuning data path and clock signal delays. To reduce circuit design area and power, as well as manage clock skew, delay cells might be placed within clock signal paths, as opposed to modifying the numerous data and clock signal paths of the IC, which is a time consuming and expensive part of the design process. Introduction of delay cells allows for optimization of clock networks by tuning with inserted delays to correct timing issues, with fewer cell changes to the IC design.

FIG. 1 shows a circuit diagram of a typical prior art delay cell 100. As shown in FIG. 1, a typical delay cell comprises a string of cascaded CMOS inverters, shown as 102(1)-102(N), where N is typically a positive even integer. Each CMOS inverter is typically implemented in a similar manner. For example, CMOS inverter 102(1) comprises PMOS transistor 104(1) and NMOS transistor 106(1) coupled in a cascade configuration, where the gate node of both transistors 104(1) and 106(1) is coupled to an input signal, shown as Vin. The source node of PMOS transistor 104(1) is coupled to a first power supply signal, shown as Vdd, and the source node of NMOS transistor 106(1) is coupled to a second power supply signal, shown as Vss, where Vdd is at a greater voltage potential than Vss (i.e. Vss is less than Vdd). The drain node of PMOS transistor 104(1) is coupled to the drain node of NMOS transistor 106(1), providing an output signal, Vout(1). Output signal Vout(1) might be provided to a next CMOS inverter 102 (e.g., CMOS inverter 102(2), not explicitly shown in FIG. 1), or might be provided as the output of delay cell 100 (e.g., Vout(N)).

In general, each CMOS inverter 102(1)-102(N) might be implemented such that each of transistors 104 and 106 has a non-minimum channel length so as to create relatively slower inverters, thus creating delay elements, where the channel length of a transistor is the distance between the source node and the drain node. A shorter channel length corresponds to faster switching by the transistor. To increase or decrease the delay, additional inverters might be added or subtracted from delay cell 100 (e.g., N might be increased or decreased), or the channel length of each of transistors 104 and 106 might be increased or decreased to achieve a target delay time for delay cell 100. Inverter 102(1)-102(N) might typically employ transistors having a long channel length (e.g., 5 times the minimum channel length of the CMOS technology). Delay cell 100 might typically be implemented having values of N (e.g., the number of inverter stages) from 2 to 10 or more. Further, delay cell 100 might be modified to have different output inverter drive strengths to accommodate signal loading variations in different applications. Increasing or decreasing the number of inverters 102 in delay cell 100, changing the channel length of the transistors 104 and 106, and changing the drive strength for output inverter 102(N) all impact the overall physical size of delay cell 100 on the silicon of an IC. Thus, each time delay value might correspond to a delay cell of a unique physical size. Circuit element sizes are commonly measured as grids in standard cell library terms, where a grid is typically the unit size of the overlying routing grid of the IC.

Delay cells typically found in standard cell libraries each have a unique cell size depending on the delay value, since the delay value is based on the number of delay elements, the size of the delay elements, and the drive strength of the output inverter of the delay cell. The drive strength might need to be increased or decreased, for example, based on a number of clock sinks coupled to the output of the delay cell. During timing closure, if it is determined that a timing change is needed for more or less delay, regardless of the timing delta, the IC designer thus needs to select a different delay cell from the standard cell library. The switch to a different delay cell could create significant disruption to the current place and route results depending on the size difference between delay cells. Subsequent place and route results could then produce signal parasitic differences, introducing further difficulties in the timing closure process.

FIGS. 2a and 2b show an exemplary IC design layout of the prior art. As shown in FIG. 2a, an IC design might comprise one or more cell rows, shown as cell rows 202 and 206, where the cell rows are interconnected by cell interconnect grid 204. Each cell row might allow an IC designer to place one or more circuit elements from the cell library, shown generally as cells 210. Routing of signals between cells can be set by cell interconnect grid 204. As shown in FIG. 2a, the IC designer has first placed a delay cell 1, which occupies cell area 208, and which has a given delay value. If, in the course of timing closure, the IC designer determines that a different delay value is required to meet timing requirements of the IC, the designer must select a different delay cell from the cell library that has the desired delay value. As shown in FIG. 2b, delay cell 2, having a larger delay value than delay cell 1, is placed into the IC design. Delay cell 2 occupies cell area 208 taken up by delay cell 1, plus additional cell area 222. By occupying a larger cell area, employing delay cell 2 rather than delay cell 1 might also require changes to the locations of one or more surrounding cells 210 and also to signal routing in cell interconnect grid 204, indicated as shaded area 224.

Further, as CMOS technology continues to reduce geometry to provide smaller and faster devices, relatively large delays (e.g., hundreds of ps or 1 ns) become difficult to obtain without a very large delay cell area. Typical delay cell elements for large delays employ a series of CMOS inverters where the internal inverters use very long channel length transistors—often three to ten times the minimum channel length for the given CMOS technology. These very long channel transistors create difficulties in trying to maintain balanced rise/fall delays across the operating range of manufacturing process, voltage and temperature (PVT) worst-case slow (WCS) and worst-case fast (WCF) variations of the IC.

Another problem with long-channel transistors occurs during manufacturing testing of initial integrated circuit silicon. To emulate the WCS to WCF variation in silicon using one manufacturing lot, Polysilicon Gate (poly-gate) Critical Dimension (CD) variation is often performed. Poly-gates that are slightly widened or narrowed alter a transistor's switching performance and, therefore, circuit path delays. For example, a +/−5% poly-gate CD variation used for 40 nm CMOS technology corresponds to a poly-gate variation of +/−2 nm. However, a delay cell employing long-channel transistors (e.g., 120 nm), when varied by the same amount as other standard cell gates in the design (e.g., 2 nm), exhibits relatively negligible delay variation. With circuit timing closure achieved using accurately modeled WCS and WCF timing simulation libraries, silicon produced with poly-gate CD variation might have inaccurate skew of delay cell paths versus normal standard cell paths, resulting in timing problems and, in the worst-case, circuit failure.

SUMMARY OF THE INVENTION

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Described embodiments provide a delay cell for a complementary metal oxide semiconductor integrated circuit. The delay cell includes a delay stage to provide an output signal having a programmable delay through the delay cell. The delay cell has a selectable delay value from a plurality of delay values, where the cell size and terminal layout of the delay cell are relatively uniform for the plurality of delay values. The delay stage includes M series-coupled inverter stages. Each series-coupled inverter stage includes N pairs of stacked PMOS transistors and stacked NMOS transistors. The N transistor pairs have configurable source-drain node connections between a drain node and a source node of each transistor in the pair, wherein the selectable delay value corresponds to a configuration of the configurable source-drain node connections to adjust a delay value of each of the M inverter stages.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

FIG. 2a and FIG. 2b show block diagrams of exemplary IC layouts employing delay cells of the prior art;

FIG. 3 shows schematic diagram of a delay cell in accordance with exemplary embodiments of the present invention;

FIG. 7a and FIG. 7b show block diagrams of exemplary IC layouts employing the delay cell of FIG. 3;

FIG. 8 shows an exemplary flow diagram for modifying the delay value and drive strength of the delay cell of FIG. 3, in accordance with exemplary embodiments of the present invention;

DETAILED DESCRIPTION

Figure 1:
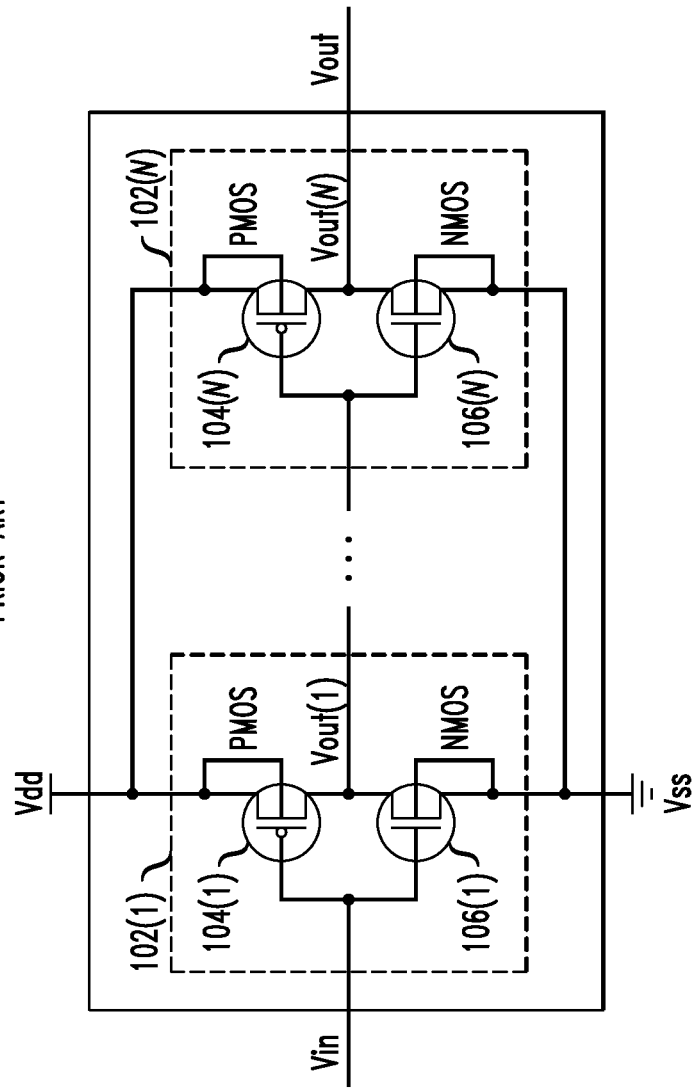
FIG. 1 shows a circuit diagram of a delay cell of the prior art.

Described embodiments of the present invention provide a delay cell for a complementary metal oxide semiconductor integrated circuit. The delay cell includes a delay stage to provide an output signal having a programmable delay through the delay cell. The delay cell has a selectable delay value from a plurality of delay values, where the cell size and terminal layout of the delay cell are relatively uniform for the plurality of delay values. The delay stage includes M parallel-coupled inverter stages. Each parallel-coupled inverter stage includes N pairs of stacked PMOS transistors and stacked NMOS transistors. N−1 of the N transistor pairs have configurable source-drain node connections between a drain node and a source node of each transistor in the pair, wherein the selectable delay value corresponds to a configuration of the configurable source-drain node connections to adjust a delay value of each of the M inverter stages.

Table 1 summarizes a list of acronyms employed throughout this specification as an aid to understanding the described embodiments of the present invention:

TABLE 1

| CMOS | Complementary metal oxide semiconductor | IC | Integrated Circuit |
|---|---|---|---|
| NMOS | N-channel MOS | PMOS | P-channel MOS |
| PVT | Process, Voltage, Temperature | PLL | Phase-Locked Loop |
| Poly-gate | Polysilicon gate | CD | Critical Dimension |
| Vdd | Positive supply voltage | Vss | Negative supply voltage/ground |
| WCS | Worst-case Slow | WCF | Worst-case Fast |

TABLE 1-continued

| Tsu | Setup Time | Tc | Clock Delay Time |
| Td | Delay Time | | |

FIG. 3 shows a block diagram of programmable delay cell 300 in accordance with embodiments of the present invention. As shown in FIG. 3, programmable delay cell 300 might comprise input inverter 314, output inverter 316 and a delay stage, shown generally as 318. Input inverter 314 might receive input signal Vin and comprise PMOS transistor 306 and NMOS transistor 308, where input signal Vin is provided to the gate nodes of PMOS transistor 306 and NMOS transistor 308. The source node of PMOS transistor 306 is coupled to the Vdd power supply rail, the source node of NMOS transistor 308 is coupled to the Vss power supply rail, and the drain node of PMOS transistor 306 is coupled to the drain node of NMOS transistor 308, and thereby, provides an output signal to delay stage 318. Output inverter 316 might employ PMOS transistor 310 and NMOS transistor 312 and provide output signal Vout, where an input signal from delay stage 318 is provided to the gate nodes of PMOS transistor 310 and NMOS transistor 312. The source node of PMOS transistor 310 is coupled to the Vdd power supply rail, the source node of NMOS transistor 312 is coupled to the Vss power supply rail, and the drain node of PMOS transistor 310 is coupled the drain node of NMOS transistor 312, and thereby, provides output signal Vout.

Delay stage 318 might employ multiple inverters comprising stacked PMOS and NMOS transistors, shown as PMOS transistors 302 and NMOS transistors 304. As shown in FIG. 3, each stack of PMOS transistors 302 and NMOS transistors 304 might employ up to N transistors, where N is a positive integer. In some embodiments of the present invention, N might desirably be equal to 4, such that each inverter has a stack of 4 PMOS transistors 302 and 4 NMOS transistors 304. In some embodiments of the present invention, M might desirably be equal to 4, such that delay stage 318 has 4 inverter stages, shown as 318(1)-318(M). As shown, each delay stage 318(1)-318(M) includes PMOS transistors 302(1)-302(N) and NMOS transistors 304(1)-304(N). Thus, in some embodiments, delay stage 318 might be a matrix of 4 inverter stages 318(1)-318(4), each inverter stage having 4 PMOS transistors 302 and 4 NMOS transistors 304. Delay cell 300 might be implemented in a standard IC design cell library such that it is always N by M, and thus is always the same physical size, regardless of the delay value for each occurrence of delay cell 300 throughout a given IC design.

As shown, the first PMOS transistor in each inverter stage (e.g., PMOS transistors 302(1)(1)-302(1)(M)) has its drain node coupled to the drain node of the first NMOS transistor in each inverter stage (e.g., NMOS transistors 304(1)(1)-304(1)(M)), providing an output signal to the gate nodes of the transistors of the next inverter stage. The last PMOS transistor in each inverter stage (e.g., PMOS transistors 302(N)(1)-302(N)(M)) has its source node connected to the Vdd power supply rail. Intermediate PMOS transistors (e.g., PMOS transistors 302(2)(1), 302(3)(1), etc.) are coupled in a stack (e.g., drain node to source node) between the first PMOS transistor (e.g., PMOS transistor 302(1)(1)) and the last PMOS transistor (e.g., PMOS transistor 302(N)(1)) of each stage. Similarly, the last NMOS transistor in each inverter stage (e.g., NMOS transistors 304(N)(1)-304(N)(M)) has its source node connected to the Vss power supply rail. Intermediate NMOS transistors (e.g., NMOS transistors 304(2)(1), 304(3)(1), etc.) are coupled in a stack (e.g., drain node to source node) between the first NMOS transistor (e.g., NMOS transistor 304(1)(1)) and the last NMOS transistor (e.g., NMOS transistor 304(N)(1)) of each inverter stage.

As shown in FIG. 3, other than the first PMOS transistor (e.g., PMOS transistors 302(1)(1)-302(1)(M)), each PMOS transistor of each inverter stage (e.g., PMOS transistors 302(2)(1)-302(N)(1), etc.) has a configurable connection between its source and drain regions, as indicated by the dashed lines. These configurable connections are employed to achieve a programmable delay value for delay cell 300. In embodiments of the present invention, an IC designer might program the delay value of delay cell 300 by modifying the configurable connections, for example, by modifying only the metal-1 interconnect layout of the delay cell in an IC design layout. The programmable delay value of delay cell 300 is determined by making the series transistor connections 1, 2, 3, or N transistors deep by selectively modifying the metal-1 interconnect layout to either short or open given ones of the configurable connections. Since, in a given IC design, every occurrence of delay cell 300 has the same values of N and M, and thus the same physical size, every occurrence of delay cell 300 in the IC design is identical in physical size and terminal locations (e.g., metal-2 signal pin connections), regardless of its delay value.

In some embodiments of the present invention, M might be an even number to implement a non-inverting programmable delay cell. In other embodiments, M might be an odd number to implement an inverting programmable delay cell. Thus, an IC design library might be configured to include both inverting and non-inverting embodiments of programmable delay cell 300.

Figure 4:
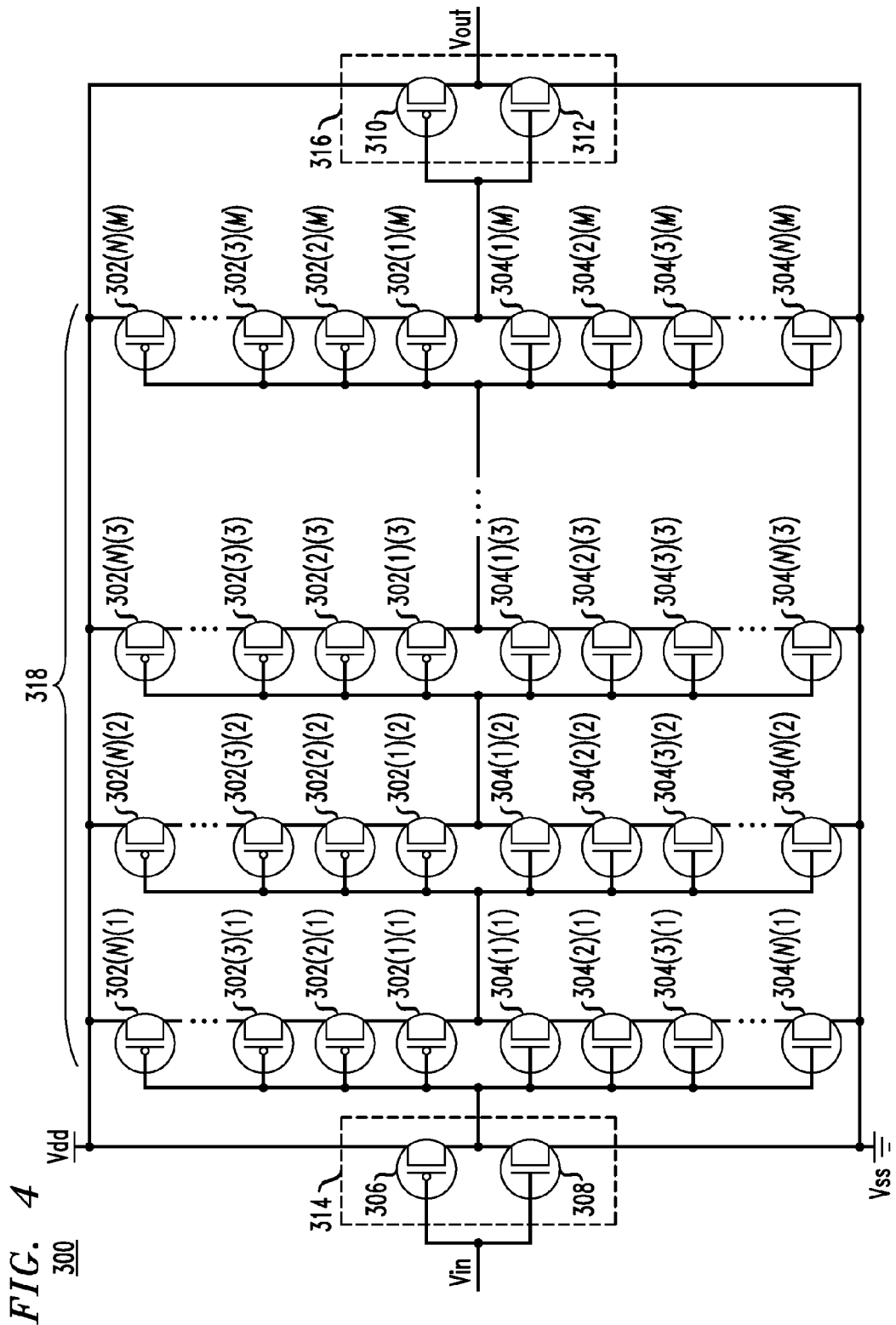
FIG. 4 shows a schematic diagram of the delay cell of FIG. 3, implemented for a maximum delay value in accordance with exemplary embodiments of the present invention.

For example, as shown in FIG. 4, delay cell 300 is configured to achieve a maximum delay value. As described herein, the maximum delay for each inverter stage is attained by employing the most transistors in each inverter stage. Thus, the configurable connections for each of transistors 302(2)-302(N) and 304(2)-304(N) are removed on the metal-1 layout of the delay cell. For example, in some embodiments where N and M equal 4, the maximum delay value of delay cell 300 is attained by having all 4 PMOS transistors 302 and all 4 NMOS transistors 304 in series, where the configurable connections are removed from the metal-1 layout, thus creating the slowest inverter stages of delay cell 300.

Figure 5:
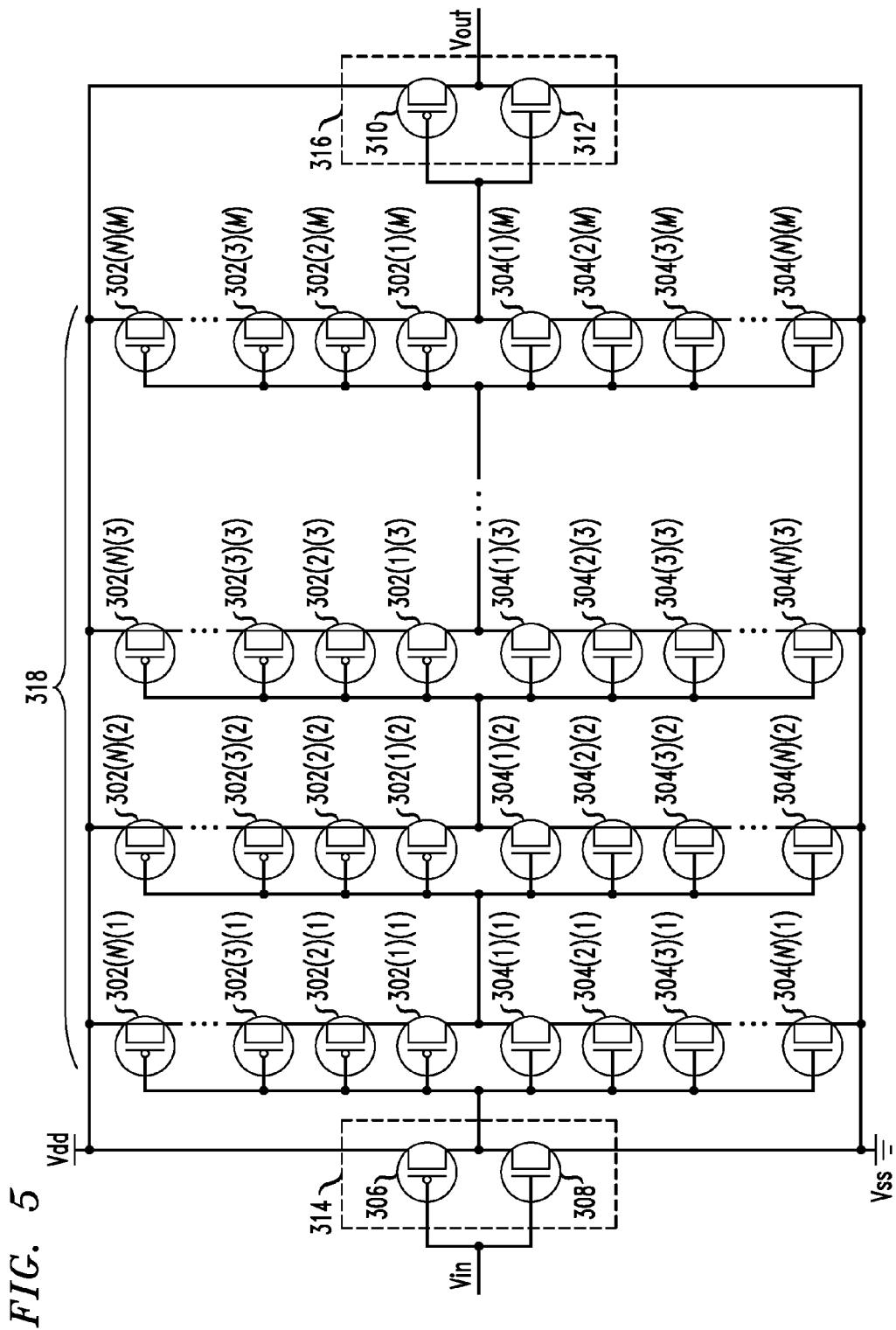
FIG. 5 shows a schematic diagram of the delay cell of FIG. 3, implemented for a minimum delay value in accordance with exemplary embodiments of the present invention.

As shown in FIG. 5, delay cell 300 is configured to achieve a minimum delay value. As described herein, the minimum delay for each inverter stage is attained by employing the fewest transistors in each inverter stage. Thus, the configurable connections for each of transistors 302(2)-302(N) and 304(2)-304(N) are placed in the metal-1 layout of the delay cell to short out each of transistors 302(2)-302(N) and 304(2)-304(N). Thus, the minimum delay value of delay cell 300 is attained by having only one PMOS transistor 302 and only one NMOS transistor 304 in each inverter stage, where the configurable connections are placed in the metal-1 layout, thus creating the fastest inverter stages of delay cell 300.

Thus, as described herein, delay cell 300 can be programmed to have varying delay values based on the needs of an IC designer by varying the metal-1 layout of the delay cell, but without changing the physical size or terminal locations of the delay cell found in the cell library. Thus, during timing closure, if it is determined that a timing change is needed for more or less delay, the IC designer does not need to select a different delay cell from the standard cell library, but rather edits the metal-1 layout of the delay cell to add or remove configurable connections of the transistors. Thus, the current place and route results are not disturbed because there is no size difference between delay cells of different delay values.

In accordance with embodiments of the present invention, during design, when the IC designer changes a delay cell value, the various changes to the internal metal-1 layer of programmable delay cell 300 (e.g., the metal-1 changes described in regard to FIGS. 3-5) are "invisible" to the designer, who just places a programmable delay cell 300 from a library having a metal-1 layout corresponding to the desired delay value. Thus, if after the IC silicon has been manufactured an unforeseen timing issue occurs, a change in the delay value of programmable delay cell 300 might be adjusted such that the timing issue is corrected and only a metal-1 layer revision is required to fix timing instead of a total silicon design revision. In a typical 28 nm library, programmable delay cell 300 might have typical values expressed in a given number of inverter delays. For example, the typical 28 nm design library might include programmable delay cells having one or more of the following exemplary values: DEL0, 3.0 INV delays; DEL1, 3.4 INV delays; DEL2, 5.4 INV delays; DEL3, 7.3 INV delays; and DEL4, 9.4 INV delays.

Further, each transistor of delay cell 300 might be implemented having a channel length equal to the minimum channel length of the CMOS technology of the IC design. Thus, all of transistors 302(1)(1)-302(N)(M), 304(1)(1)-304(N)(M), 306, 308, 310 and 312 might have a channel length equal to the minimum channel length of the CMOS technology of the IC design. For example, in an IC design employing 40nm CMOS technology, each of transistors 302(1)(1)-302(N)(M), 304(1)(1)-304(N)(M), 306, 308, 310 and 312 might have a channel length equal to 40 nm, rather than needing a longer channel length to attain the desired delay value (e.g., 120 nm channel length).

Figure 6A:
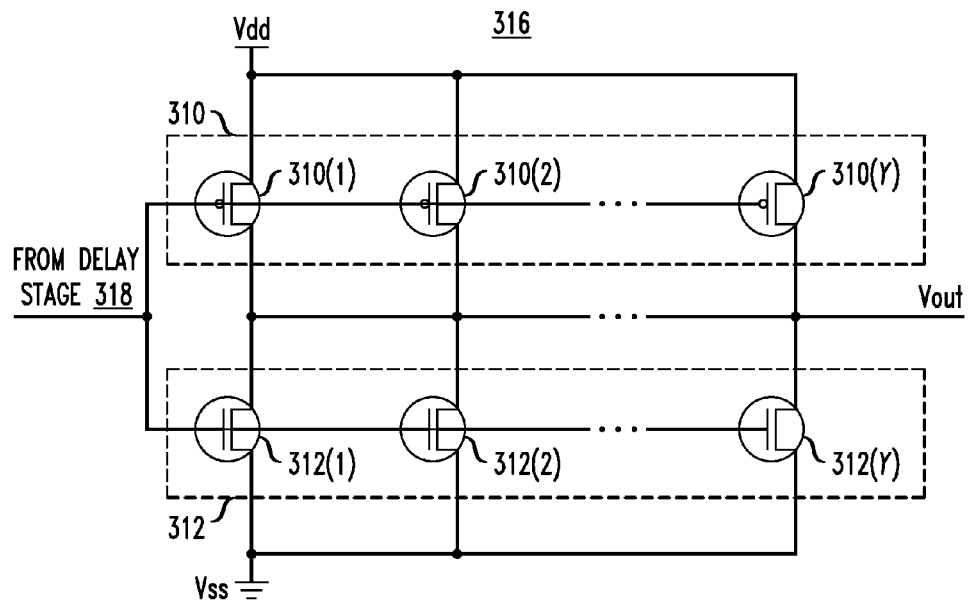
FIG. 6a shows a schematic diagram of an output stage of the delay cell of FIG. 3, implemented for a maximum drive strength value in accordance with exemplary embodiments of the present invention.

Embodiments of the present invention also provide for programmable drive strength of delay cell 300. As shown in FIG. 6a, each of transistors 310 and 312 of output stage 316 might be implemented as one or more transistors in parallel, to allow for higher output currents provided as output signal Vout. For example, PMOS transistor 310 might be implemented as PMOS transistors 310(1)-310(Y), where Y is a positive integer. Similarly, NMOS transistor 312 might be implemented as NMOS transistors 312(1)-312(Y). The drive strength capability of delay cell 300 is set by the number of transistors 310(1)-310(Y) and 312(1)-312(Y) that are employed in output stage 316 (e.g., the value of Y determines the drive strength of output stage 316). For example, in embodiments where Y is equal to 4, selectably using 1, 2 or 4 of transistors 310(1)-310(Y) and 312(1)-312(Y) corresponds to a 1×, 2×, or 4× relative drive strength. The absolute drive strength is based on the technology of the CMOS transistors. For example, in a 40 nm CMOS IC, typical drive strengths for 1×, 2× and 4× drives might be equal to the library inverter cells INVX1, INVX2, INVX4, respectively.

Figure 6B:
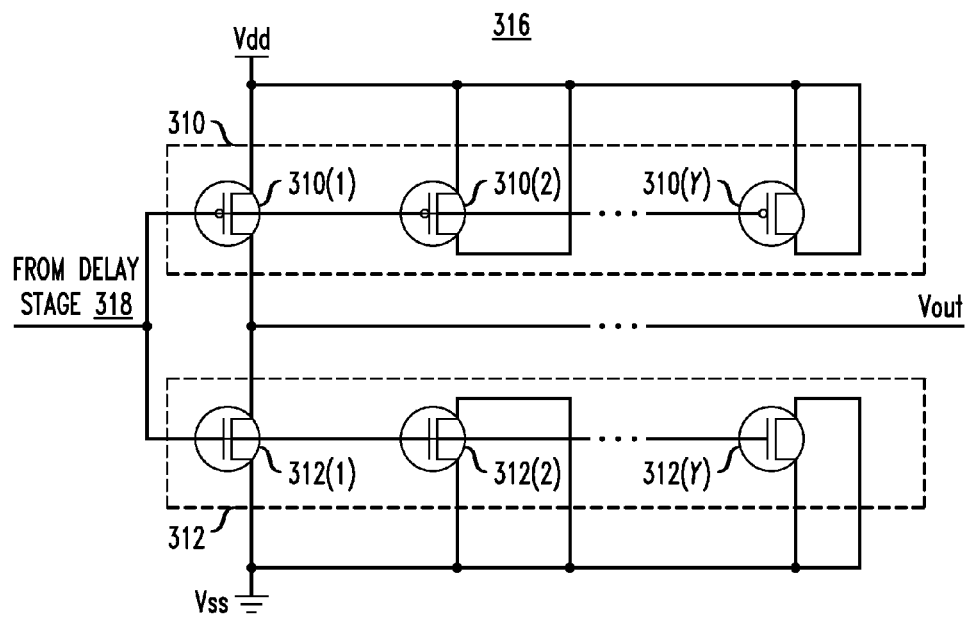
FIG. 6b shows a schematic diagram of an output stage of the delay cell of FIG. 3, implemented for a minimum drive strength value in accordance with exemplary embodiments of the present invention.

The programmable drive strength of delay cell 300 is determined by setting the parallel transistor connections of 1, 2 or Y transistors by selectively modifying the metal-1 interconnect layout to either connect or disconnect given ones of the parallel transistors from the output signal Vout. As shown in FIG. 6a, output stage 316 is set for maximum drive strength since all transistors 310(1)-310(Y) and 312(1)-312(Y) are connected in parallel to output signal Vout. As shown in FIG. 6b, output stage 316 is set for minimum drive strength since only transistors 310(1) and 312(1) are connected to output signal Vout, while transistors 310(2)-310(Y) and 312(2)-312(Y) are disconnected from output signal Vout. For example, transistors 310(2)-310(Y) are disconnected from output signal Vout by having their drain nodes rerouted to connect to Vdd, and transistors 312(2)-312(Y) are disconnected from output signal Vout by having their drain nodes coupled to Vss.

Since, in a given IC design, every occurrence of delay cell 300 has the same values of Y, and thus the same physical size, every occurrence of delay cell 300 in the IC design is identical in physical size and terminal location, regardless of its drive strength value.

Thus, as described herein, delay cell 300 can be programmed to have varying drive strength based on the needs of an IC designer by varying the metal-1 layout of the delay cell, but without changing the physical size or terminal locations of the delay cell found in the cell library. Thus, if it is determined that a delay cell needs to have a stronger drive strength, for example if additional circuit elements are coupled to the delay cell output, the IC designer does not need to select a different delay cell from the standard cell library, but rather edits the metal-1 layout of the delay cell to add or remove drain connections of transistors 310(2)-310(Y) and 312(2)-312(Y) of output stage 316. Thus, the current place and route results are not disturbed because there is no size difference between delay cells of different drive strengths.

FIGS. 7a and 7b show an exemplary IC design layout. As shown in FIG. 7a, an IC design might comprise one or more cell rows, shown as cell rows 702 and 706, where the cell rows are interconnected by cell interconnect grid 704. Each cell row might allow an IC designer to place one or more circuit elements from the cell library, shown generally as cells 710. Routing of signals between cells can be set by cell interconnect grid 704. Standard place and route procedures involve the optimized, compact abutment of all cells in the circuit and the necessary multi-metal layer connectivity of the associated signal wires. As shown in FIG. 7a, the IC designer has first placed programmable delay cell 1, which occupies cell area 708, and which has a given delay value. If, in the course of timing closure, the IC designer determines that a different delay value is required to meet timing requirements of the IC, the designer might modify the metal-1 layout of programmable delay cell 1 to have a desired delay value. As shown in FIG. 7b, programmable delay cell 1 has its metal-1 layout modified to become programmable delay cell 2, having a larger delay value than programmable delay cell 1. However, programmable delay cell 2 occupies the same cell area, 708 as programmable delay cell 1, despite having a larger delay value than programmable delay cell 1. By occupying the same cell area, no changes are required to the layout of one or more surrounding cells 710, or to signal routing in cell interconnect grid 704, thereby significantly reducing the effort involved in circuit timing verification and modification. Similarly, changing the drive strength of delay cell 708 also has no impact on occupied cell area and, thus, no changes are required to the layout of one or more surrounding cells 710, or to signal routing in cell interconnect grid 704 to change the drive strength.

FIG. 8 shows a flow diagram of exemplary IC design process 800. At step 802, IC design process 800 is started by an IC designer. At step 804, the IC designer performs cell placement of circuit elements from a design library, and routes signals from cell to cell. Such cell placements and signal routings might be done manually, automatically or a combination of both. At step 806, the IC designer performs delay time and drive strength tolerance analysis, for example, based on delay tolerances in a timing library. Based on the analysis of step 806, at step 808 it is determined whether the delay value of one or more delay cells 300 require adjustment to meet timing requirements for the IC design. If, at step 808 the delay value of one or more delay cells 300 needs to be adjusted, at step 810, it is determined whether the delay value of a given delay cell 300 needs to be increased or decreased. If, at step 810 the delay value of a given delay cell 300 needs to be increased, at step 812 the IC designer modifies the metal-1 mask layer of the delay cell to add one or more additional pairs of PMOS and NMOS transistors to each inverter stage of delay stage 318. For example, as described herein, the IC designer might remove the configurable drain-to-source connections of one or more of PMOS transistors 302(2)-302(N) and NMOS transistors 304(2)-304(N) to increase the delay value. If, at step 810 the delay value of a given delay cell 300 needs to be decreased, at step 814 the IC designer modifies the metal-1 mask layer of the delay cell to remove one or more pairs of PMOS and NMOS transistors from each inverter stage of delay stage 318. For example, as described herein, the IC designer might add the configurable drain-to-source connections of one or more of PMOS transistors 302(2)-302(N) and NMOS transistors 304(2)-304(N) to decrease the delay value.

After the delay values of one or more delay cells 300 are modified at steps 812 and 814, process 800 might return to step 806 to re-perform a timing analysis of the IC design with the new delay values. Notably, it is not necessary to re-perform the cell placement and signal routing of step 804 since delay cell 300 is a uniform size and footprint regardless of its delay value.

If, at step 816 the drive strength of one or more delay cells 300 needs to be adjusted, at step 818, it is determined whether the drive strength of a given delay cell 300 needs to be increased or decreased. If, at step 818 the drive strength of a given delay cell 300 needs to be increased, at step 820 the IC designer modifies the metal-1 mask layer of the delay cell to add one or more additional pairs of parallel PMOS and NMOS transistors to output stage 316 of each delay cell 300. For example, as described herein, the IC designer might move the configurable drain-to-source connections of one or more of PMOS transistors 310(2)-310(Y) and NMOS transistors 312(2)-312(Y) to increase the drive strength, for example by connecting one or more of PMOS transistors 310(2)-310(Y) and NMOS transistors 312(2)-312(Y) to output signal Vout (FIG. 10*a*). If, at step 818 the drive strength of a given delay cell 300 needs to be decreased, at step 822 the IC designer modifies the metal-1 mask layer of the delay cell to move the configurable drain-to-source connections of one or more of PMOS transistors 310(2)-310(Y) and NMOS transistors 312(2)-312(Y) to decrease the drive strength, for example by disconnecting one or more of PMOS transistors 310(2)-310(Y) and NMOS transistors 312(2)-312(Y) from output signal Vout (FIG. 10*b*).

After the drive strength of one or more delay cells 300 are modified at steps 820 and 822, process 800 might return to step 806 to re-perform a timing analysis of the IC design with the new drive strength values. Notably, it is not necessary to re-perform the cell placement and signal routing of step 804 since delay cell 300 is a uniform size and footprint regardless of its drive strength.

Figure 9:
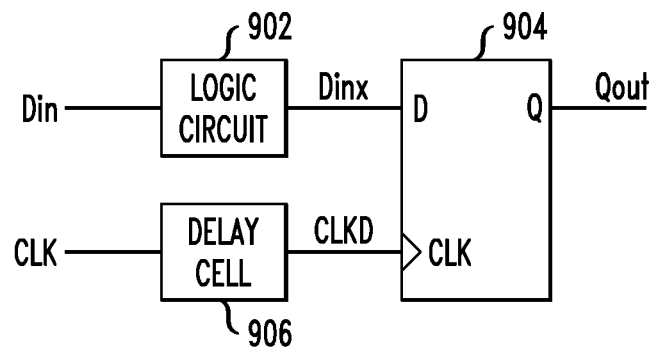
FIG. 9 shows a block diagram of an exemplary circuit employing the delay cell of FIG. 3.

FIG. 9 shows an exemplary circuit that includes delay cell 906 in the clock signal path (CLK) to ensure sufficient setup time (Tsu) for the data signal (Dinx) input to latch 904. As shown in FIG. 9, logic circuit 902 receives an input signal Din and generates an output signal Dinx. Signal Dinx is provided to latch 904. Clock signal CLK is provided to delay cell 906, which then provides delayed clock signal CLKD to latch 904. During timing closure analysis of the IC design, timing verification, including the delay value required for delay cell 906, are determined through simulations using the best known characterized worst-case slow (WCS) and worst-case fast (WCF) timing information for all cells in the IC design, where the timing information is based on a standard timing library for the cells.

Figure 10:
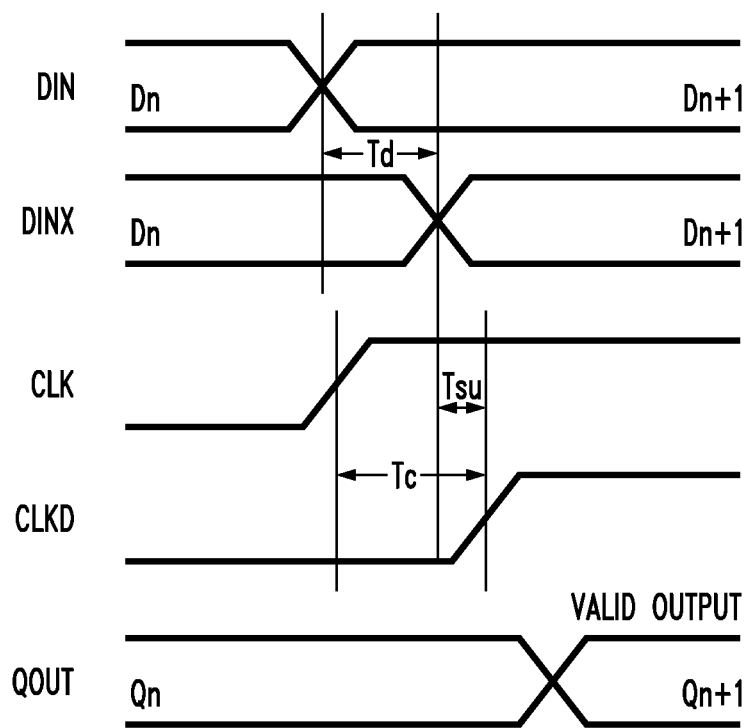
FIG. 10 shows an exemplary timing diagram of the circuit of FIG. 9.

FIG. 10 shows an exemplary timing diagram of the expected timing of the circuit shown in FIG. 9 using timing library information. As shown in FIG. 10, data signal Dinx is delayed through logic circuit 902 block by time Td. To achieve proper data setup time (Tsu), a delay is needed on the CLK signal. Thus, delay cell 906 is inserted to generate clock delay time Tc on signal CLKD, where Tc is approximately equal to Td plus Tsu, for circuit 900 operates as desired under both WCS and WCF conditions.

Figure 11:
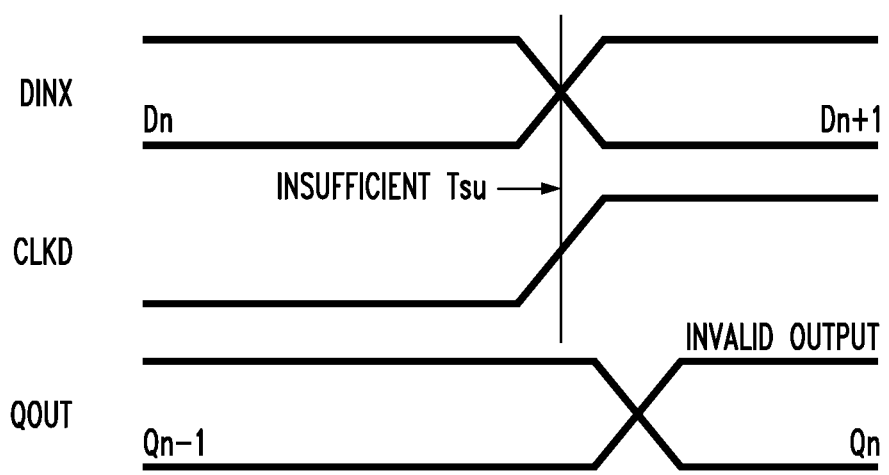
FIG. 11 shows another exemplary timing diagram of the circuit of FIG. 9.

FIG. 11 illustrates the circuit timing failure that can occur when initial design silicon is produced using a Poly-gate CD variation (+/−5%) to simulate WCS and WCF manufacturing variation when delay cell 906 employs long channel length transistors. Poly-gate CD variations on the elements in logic circuit 902 create timing delay variations on signal Dinx. Typically, a 2.5 times WCS to WCF delay variation might be seen through the logic circuit 902. However, for a delay cell employing long channel length transistors, the Poly CD variation would create little or no WCS to WCF delay variation. For example, a +/−5% variation of 40 nm is 2 nm, and a +/−2 nm variation on a 140 nm channel length transistor would provide a negligible delay variation. This could lead to a significant timing skew difference between Dinx and CLKD versus the circuit simulation timing. This timing skew could lead to IC failure, such as shown in FIG. 8, where the delayed clock signal CLKD does not allow sufficient setup time Tsu for latch 904 to output correct data. However, if delay cell 906 is implemented as programmable delay cell 300, which employs minimum channel length transistors, the Poly CD variation would also produce a 2.5× WCS to WCF delay variation in the CLK signal delay, thus maintaining Dinx and CLKD timing skew and maintaining a valid Tsu for correct operation of circuit 900, such as shown in the exemplary timing diagram of FIG. 10.

Figure 12:
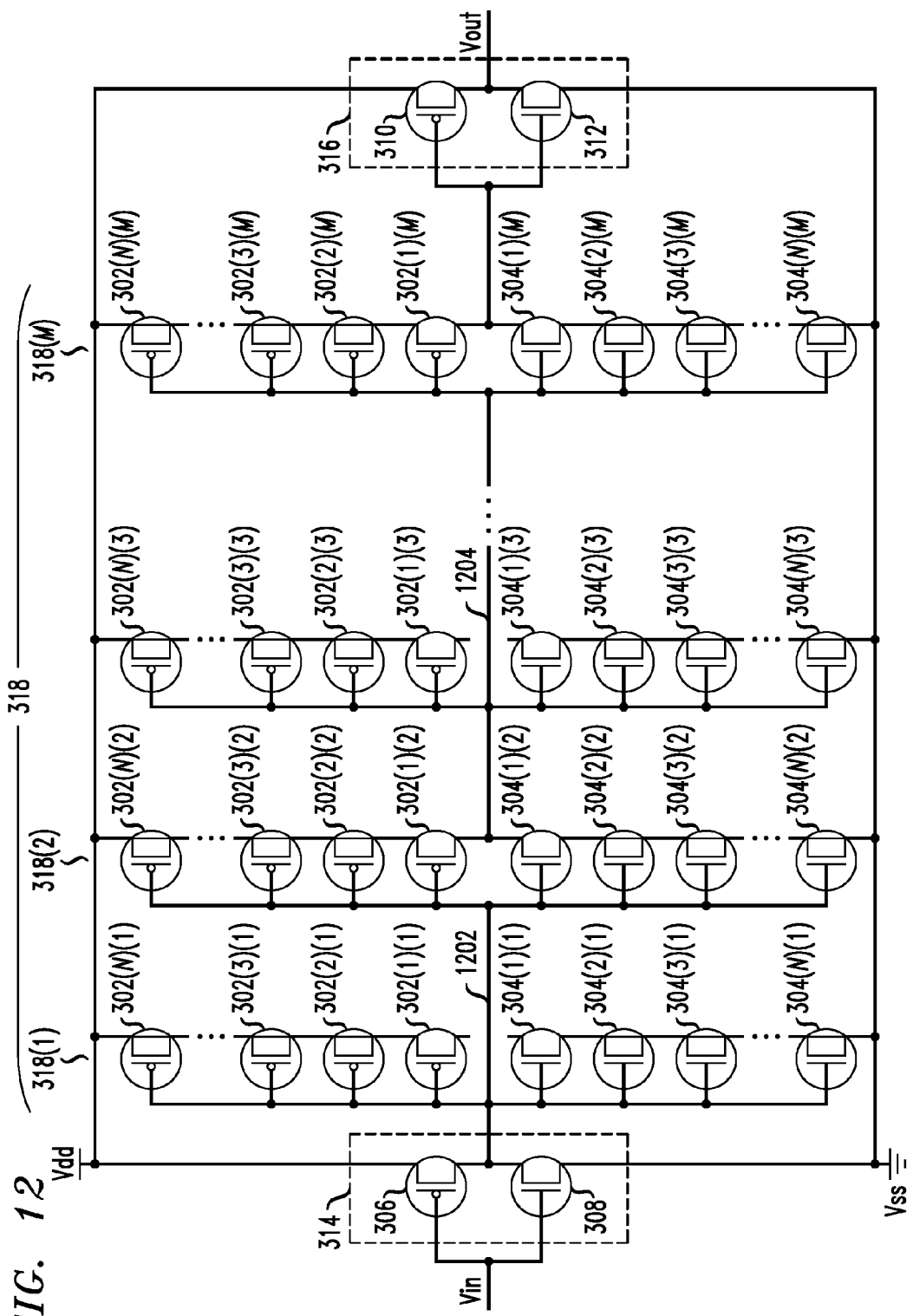
FIG. 12 shows an alternative exemplary embodiment of the delay cell of FIG. 3.

FIG. 12 shows an alternative exemplary embodiment of programmable delay cell 300. As shown in FIG. 12, to further reduce the delay of programmable delay cell 300, one or more of the series inverter stages 318(1)-318(M) might be disconnected from the series of inverter stages. As shown in FIG. 12, transistors 302(1)(1) and 304(1)(1) of inverter stage 318(1) are disconnected from the input to next inverter stage 318(2), and the input to inverter stage 318(1) is provided to inverter stage 318(2), indicated by connection 1202. Similarly, as shown in FIG. 12, transistors 302(1)(3) and 304(1)(3) of inverter stage 318(3) are disconnected from the input to next inverter stage 318(M), and the input to inverter stage 318(3) is provided to inverter stage 318(M), indicated by connection 1204. In such a manner, by eliminating one or more delay stage connections (e.g., connections 1202 and 1204 of delay stages 318(1) and 318(3)), delay of the programmable delay cell might be reduced further relative to the exemplary configuration shown in FIG. 5.

Thus, as described herein, embodiments of the present invention provide programmable delay cells that are configurable for a range of delay values and multiple output drive strength capabilities without changing the physical size or terminal layout of the programmable delay cell. By maintaining a single layout footprint regardless of delay value or drive strength, described embodiments provide non-disruptive delay cell interchange during the iterative circuit place & route and circuit timing verification design procedures. If timing delay adjustments associated with circuit paths using these programmable delay cells are required, no changes to the existing circuit interconnect wires and the associated parasitic RC wiring values are required, thus, not altering any existing, verified circuit timing Total footprint compatibility is also achieved through the use of metal-2 signal pin connections in the identical location regardless of delay values. Further, by employing minimum channel length transistors, the programmable delay cells prevent WCS to WCF delay variation larger than other standard cells in the IC design. This aids in circuit timing closure when verifying proper data path setup and hold timing across the extreme process, voltage and temperature (PVT) requirements for the circuit design, preventing data signal or clock signal delay skews that could create signal setup and hold violations under some PVT conditions.

With minor metal-1 mask layer changes to the IC design, programmable delay cell 300 might be adjusted to any delay value, for example any one of the twelve standard delay cell values commonly found in design libraries, without a disruption in circuit cell placement, or routing connections. No other manufacturing layer changes are required. This flexibility of delay cell 300 is valuable in the situation where circuit data path or clock path delays are found to need a timing adjustment after initial silicon wafer manufacture has been evaluated. Without this flexibility of delay cell 300, a delay cell change would require an engineer design change involving repeating place and route and timing closure efforts, as well as generating new silicon manufacture masks—a time consuming and expensive engineering change. As described herein, with embodiments of the described programmable delay cells, a delay cell change is possible with only a timing verification and reissue of the IC design metal-1 mask layer.

While the exemplary embodiments of the present invention have been described with respect to processes of circuits, including possible implementation as a single integrated circuit, a multi-chip module, a single card, or a multi-card circuit pack, the present invention is not so limited.

As would be apparent to one skilled in the art, various functions of circuit elements might also be implemented as processing blocks in a software program. Such software might be employed in, for example, a digital signal processor, microcontroller, or general-purpose computer. Such software might be embodied in the form of program code embodied in tangible media, such as magnetic recording media, optical recording media, solid state memory, floppy diskettes, CD-ROMs, hard drives, or any other non-transitory machine-readable storage medium, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits. The present invention can also be embodied in the form of a bitstream or other sequence of signal values electrically or optically transmitted through a medium, stored magnetic-field variations in a magnetic recording medium, etc., generated using a method and/or an apparatus of the present invention.

It should be understood that the steps of the exemplary methods set forth herein are not necessarily required to be performed in the order described, and the order of the steps of such methods should be understood to be merely exemplary. Likewise, additional steps might be included in such methods, and certain steps might be omitted or combined, in methods consistent with various embodiments of the present invention.

As used herein in reference to an element and a standard, the term "compatible" means that the element communicates with other elements in a manner wholly or partially specified by the standard, and would be recognized by other elements as sufficiently capable of communicating with the other elements in the manner specified by the standard. The compatible element does not need to operate internally in a manner specified by the standard.

Unless explicitly stated otherwise, each numerical value and range should be interpreted as being approximate as if the word "about" or "approximately" preceded the value of the value or range. Signals and corresponding nodes or ports might be referred to by the same name and are interchangeable for purposes here.

Transistors are typically shown as single devices for illustrative purposes. However, it is understood by those skilled in the art that transistors will have various sizes (e.g., gate width and length) and characteristics (e.g., threshold voltage, gain, etc.) and might consist of multiple transistors coupled in parallel to get desired electrical characteristics from the combination. Further, the illustrated transistors might be composite transistors.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements. Signals and corresponding nodes or ports might be referred to by the same name and are interchangeable for purposes here.

It will be further understood that various changes in the details, materials, and arrangements of the parts which have been described and illustrated in order to explain the nature of this invention might be made by those skilled in the art without departing from the scope of the invention as expressed in the following claims.

We claim:

1. A delay cell for a complementary metal oxide semiconductor (CMOS) integrated circuit (IC), the delay cell comprising:

a delay stage configured to provide an output signal having a programmable delay through the delay cell, the delay cell having (i) a selectable delay value from a plurality of delay values, and (ii) relatively uniform cell size and terminal layout over a range of the plurality of delay values;

an input inverter stage comprising a PMOS and NMOS transistor pair, the input inverter stage configured to transfer an input signal of the delay cell to the delay stage;

an output inverter stage configured to generate a drive strength for the output signal from the delay stage, thereby to provide an output signal of the delay cell as a delayed version of the input signal of the delay cell;

wherein the delay stage comprises:

M series-coupled inverter stages driven between first and second voltage potentials, M a positive integer, each series-coupled inverter stage comprising N transistor pairs of stacked PMOS transistors and stacked NMOS transistors, N a positive integer, a gate node of each of the stacked PMOS transistors and the stacked NMOS transistors coupled to an input of the inverter stage, wherein the N transistor pairs comprise configurable source-drain node connections between a drain node and a source node of each transistor in the pair, wherein the selectable delay value corresponds to a configuration of coupled and de-coupled source-drain node connections to adjust a delay value of each of the M inverter stages.

2. The delay cell of claim 1, wherein:
when the configurable source-drain node connection is placed between the source node and the drain node of each transistor in one of the N transistor pairs of one of the M inverter stages, the delay value of the inverter stage is reduced, and
when the configurable source-drain node connection is removed from between the source node and the drain node of each transistor in one of the N transistor pairs of one of the M inverter stages, the delay value of the inverter stage is increased.

3. The delay cell of claim 1, wherein the configurable source-drain node connections are configurable by modifying a metal-1 layout of the IC.

4. The delay cell of claim 1, wherein the output inverter stage comprises:
Y parallel output transistor pairs, each of the Y output transistor pairs comprising a PMOS transistor and an NMOS transistor, wherein the gates of the PMOS transistor and the NMOS transistor receive the delayed output signal from the delay stage;
a first output transistor pair configured to provide the output signal of the delay cell;
Y−1 configurable output transistor pairs, wherein each transistor in each of the Y−1 configurable output transistor pairs has a configurable connection to the output signal of the delay cell,
wherein the output inverter stage is configured to provide a selectable drive strength value from a plurality of drive strength values.

5. The delay cell of claim 4, wherein:
when the configurable connection of each transistor in each of the each of the Y−1 configurable output transistor pairs is coupled to the output signal of the delay cell, the drive strength of the output signal is increased; and
when the configurable connection of each transistor in each of the each of the Y−1 configurable output transistor pairs is coupled to one of the first and second voltage potentials, the drive strength of the output signal is decreased.

6. The delay cell of claim 4, wherein Y is equal to 4.

7. The delay cell of claim 4, whereby the delay cell is configured to have a substantially uniform cell size and terminal layout over a range of the plurality of drive strength values.

8. The delay cell of claim 1, wherein N is equal to 4.

9. The delay cell of claim 1, wherein M is equal to 4.

10. The delay cell of claim 1, wherein each transistor is fabricated having a channel length substantially equal to the minimum channel length of the IC.

11. The delay cell of claim 1, wherein the delay cell is configurable to any of twelve standard delay values of a standard IC cell library.

12. The delay cell of claim 1, wherein M is an odd integer value, whereby the delay cell is configured to be an inverting delay cell.

13. The delay cell of claim 1, wherein M is an even integer value, whereby the delay cell is configured to be a non-inverting delay cell.

14. The delay cell of claim 1, wherein each of the M series-coupled inverter stages comprises:
a first configurable connection between the gate node of the stacked PMOS transistors and stacked NMOS transistors and an output of the inverter stage;
a second configurable connection between the output of the inverter stage and a drain node of one of the stacked PMOS transistors and one of the stacked NMOS transistors,
wherein when the first configurable connection is placed and the second configurable connection is removed, the delay value of the inverter stage is reduced, and when the first configurable connection is removed and the second configurable connection is placed, the delay value of the inverter stage is increased.

15. A method of designing a complementary metal oxide semiconductor (CMOS) integrated circuit (IC) employing at least one programmable delay cell, the method comprising:
generating an IC design layout comprising cell placement and signal routing;
performing a polysilicon gate critical dimension variation on the IC design layout;
performing a timing analysis of the IC design layout;
determining, based on the timing analysis, whether delay values for one or more of the programmable delay cells should be modified;
if the delay values for one or more of the programmable delay cells should be modified:
changing one or more configurable connections in a metal-1 layout of the IC for each of the one or more programmable delay cells, thereby modifying the delay value of each of the one or more programmable delay cells,
maintaining, by each programmable delay cell, a uniform cell size and terminal layout for all delay values.

16. The method of claim 15, wherein the steps of generating the IC design layout comprising cell placement and signal routing, performing a polysilicon gate critical dimension variation on the IC design layout, and performing a timing analysis of the IC design layout are not repeated after changing the delay value of one or more of the programmable delay cells.

17. A method of configuring a programmable delay cell in a complementary metal oxide semiconductor (CMOS) integrated circuit (IC), the method comprising:
determining, in a timing tolerance analysis of the IC, whether one or more programmable delay cells require a change to a delay value of the programmable delay cell;
if one or more programmable delay cells require an increased delay value:
removing a configurable connection of one or more transistor pairs of one or more inverter stages of the programmable delay cell, wherein the configurable connection is a connection between a drain node and a source node of each transistor in the one or more transistor pairs, wherein removing the configurable connections is performed by modifying a metal-1 layout of the IC;
if one or more programmable delay cells require a decreased delay value:
adding a configurable connection of one or more transistor pairs of one or more inverter stages of the programmable delay cell, wherein the configurable connection is a connection between a drain node and a source node of each transistor in the one or more transistor pairs, wherein adding the configurable connections is performed by modifying a metal-1 layout of the IC; and
maintaining a uniform cell size and terminal layout for all delay values of the programmable delay cell.

18. The method of claim 17, further comprising:
determining, in a tolerance analysis of the IC, whether one or more programmable delay cells require a change to a drive strength value of the programmable delay cell;
if one or more programmable delay cells require an increased drive strength value:
moving a configurable connection of one or more parallel transistor pairs of an output stage of the programmable delay cell, wherein the configurable connection is moved to establish a connection between a drain node of each transistor in the one or more transistor pairs and an output of the programmable delay cell;
if one or more programmable delay cells require a decreased drive strength value:
moving a configurable connection of one or more parallel transistor pairs of an output stage of the programmable delay cell, wherein the configurable connection is moved to establish a connection between a drain node and a source node of each transistor in the one or more transistor pairs and remove a connection between a drain node of each transistor in the one or more transistor pairs and an output of the programmable delay cell; and
maintaining a uniform cell size and terminal layout for all drive strength values of the programmable delay cell;
wherein the steps of moving the configurable connections are performed by modifying a metal-1 layout of the IC.

19. The method of claim 18, wherein the output stage comprises 4 transistor pairs in parallel.

20. The method of claim 17, wherein the programmable delay cell comprises 4 inverter stages.

21. The method of claim 17, wherein each inverter stage comprises 4 PMOS transistors connected in series drain node to source node, and 4 NMOS transistors connected in series drain node to source node.

22. The method of claim 17, further comprising:
fabricating each transistor of the programmable delay cell with a channel length substantially equal to the minimum channel length of the IC.

23. The method of claim 17, further comprising:
setting the delay value of the programmable delay cell equal to one of twelve standard delay values of a standard IC cell library.

24. The method of claim 17, further comprising:
if one or more programmable delay cells require an decreased delay value:
placing a first configurable connection between the gate node of the stacked PMOS transistors and stacked NMOS transistors and an output of the inverter stage; and
removing a second configurable connection between the output of the inverter stage and a drain node of one of the stacked PMOS transistors and one of the stacked NMOS transistors,
if one or more programmable delay cells require an increased delay value:
removing the first configurable connection between the gate node of the stacked PMOS transistors and stacked NMOS transistors and an output of the inverter stage; and
placing the second configurable connection between the output of the inverter stage and a drain node of one of the stacked PMOS transistors and one of the stacked NMOS transistors.

25. The method of claim 24, further comprising:
configuring the delay cell as an inverting delay cell.

26. The method of claim 25, wherein the step of configuring the delay cell as an inverting delay cell comprises:
removing the first configurable connection and placing the second configurable connection for an odd number of delay stages of the delay cell.

27. The method of claim 24, further comprising:
configuring the delay cell as a non-inverting delay cell.

28. The method of claim 27, wherein the step of configuring the delay cell as a non-inverting delay cell comprises:
removing the first configurable connection and placing the second configurable connection for an even number of delay stages of the delay cell.

* * * * *